United States Patent [19]

Susak et al.

[11] Patent Number: 5,604,373

[45] Date of Patent: Feb. 18, 1997

[54] CIRCUIT AND METHOD OF REVERSE VOLTAGE PROTECTION USING A LATERAL TRANSISTOR HAVING A COLLECTOR RING SURROUNDING ITS BASE REGION

[75] Inventors: David M. Susak, Phoenix; Randall C. Gray, Tempe, both of Ariz.

[73] Assignee: Motorola, Inc., Schaumburg, Ill.

[21] Appl. No.: 415,889

[22] Filed: Apr. 3, 1995

[51] Int. Cl.$^6$ ................................................. H01L 23/60
[52] U.S. Cl. ........................ 257/546; 257/170; 257/173; 257/557; 257/593
[58] Field of Search .................................. 257/170, 173, 257/593, 546, 355, 537

[56] References Cited

U.S. PATENT DOCUMENTS 5,272,371  12/1993  Bishop et al. ........................... 257/361

FOREIGN PATENT DOCUMENTS 0022163  1/1992  Japan ..................................... 257/546

Primary Examiner—Sara W. Crane
Assistant Examiner—David B. Hardy
Attorney, Agent, or Firm—Robert D. Atkins

[57] ABSTRACT

A lateral transistor (14) is configured as a reverse protection diode that allows low and high current modes of operation while maintaining low forward voltage drop. The base region (38) of the lateral transistor is formed inside a collector ring (34) and adjacent to the emitter region (36). In low current mode, the transistor operates as a conventional diode. In high current mode, the excessive number of minority carriers injected into the base region causes the device to enter conductivity modulation that effectively increases the doping concentration and lowers the bulk resistance. The lower bulk resistance keeps the forward voltage drop low. By having the base region inside the collector ring, the bulk resistance is kept low to aid in the onset of conductivity modulation. Thus, the transition between low current mode and high current mode is minimized.

20 Claims, 2 Drawing Sheets

CIRCUIT AND METHOD OF REVERSE VOLTAGE PROTECTION USING A LATERAL TRANSISTOR HAVING A COLLECTOR RING SURROUNDING ITS BASE REGION

BACKGROUND OF THE INVENTION

The present invention relates in general to integrated circuits and, more particularly, to reverse voltage protection of an integrated circuit.

Most if not all integrated circuits require a power supply potential to energize the internal transistors for proper operation. In many applications, it is possible to inadvertently reverse the polarity of the power supply potential. For example, in an automotive application, the battery may be connected backwards with the negative supply to the positive power supply conductor. Without some form of reverse voltage protection, such a reverse voltage connection could damage integrated circuits (IC) within the automobile.

One known technique is to place a high current discrete diode in series between the battery and the positive power supply bus that goes to the ICs requiring protection. A reverse voltage from the battery simply reverse biases the diode and protects the ICs. Although a fully charged battery typically supplies 12.0 volts DC, automotive manufacturers are demanding the ICs continue to operate should the battery voltage drop as low as 5.0 volts DC. The discrete diode typically has a forward voltage drop of 1.0 volt and increases with more current flow. In high current applications, the large forward voltage diode drop leaves only 4.0 volts or less operating potential headroom for the ICs. In some IC designs, 4.0 volts DC may not provide sufficient operating potential headroom for MOS devices over a full temperature range.

Another option is to place a conventional lateral PNP transistor configured as a diode in series with the positive power supply conductor on each IC that requires reverse voltage protection. Placing one diode-configured transistor on each IC keeps the forward voltage drop to acceptable limits. Unfortunately, the conventional lateral PNP diode requires many emitters to handle the current load of say up to 100 milliamps (Ma) because each emitter can typically handle only 0.5 Ma. The large number of emitters (200+) cause the lateral PNP diode to consume an enormous area on the IC die.

Hence, a need exists for reverse voltage protection that can handle a wide range of supply current and that does not consume excessive IC die area.

DETAILED DESCRIPTION OF THE PREFERRED EMBODIMENT

Figure 1:
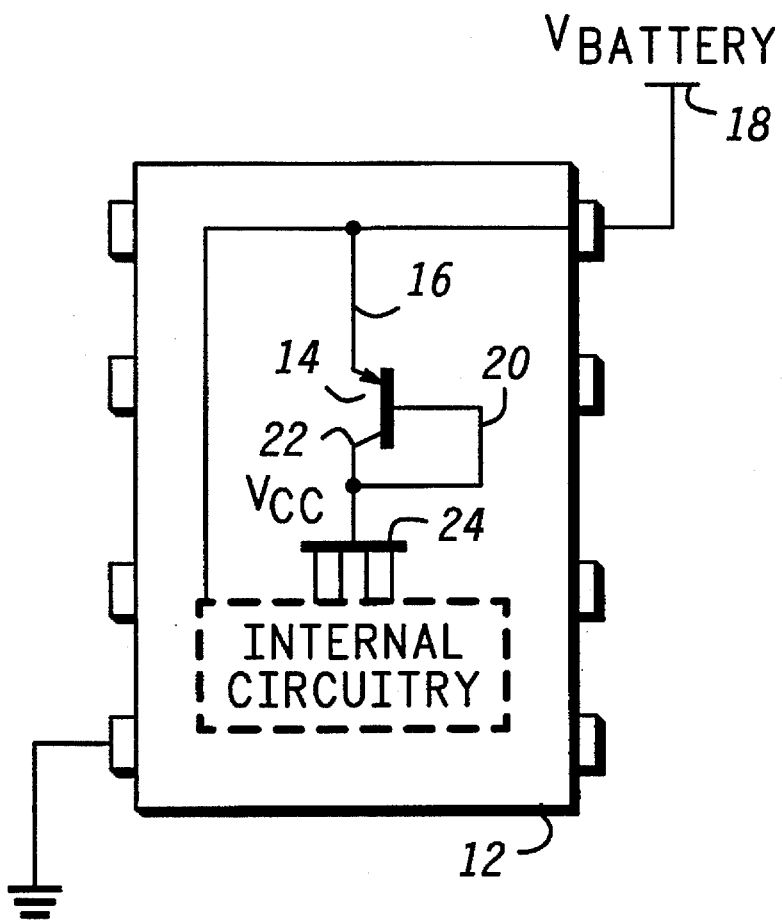
FIG. 1 is a schematic diagram of a diode-configured lateral PNP transistor configured within an IC.

Referring to FIG. 1, a reverse voltage protection diode is shown suitable for manufacturing within an integrated circuit (IC) 12 using conventional IC processes. The reverse protection diode is implemented as a lateral PNP transistor 14 having an emitter 16 coupled to power supply conductor 18 and having a base 20 and a collector 22 coupled together to power supply conductor 24. IC 12 may be one of the numerous electronic circuits in an automobile that receives an operating potential $V_{BATTERY}$ of 12.0 volts on power supply conductor 18 from the automotive battery source. The internal circuitry of IC 12 receives operating potential $V_{CC}$ from power supply conductor 24. Some of the internal circuitry of IC 12 may also receive operating potential $V_{BATTERY}$ directly from power supply conductor 18. PNP transistor 14 provides reverse voltage protection for the internal circuitry that is coupled to power supply conductor 24 should a reverse voltage be applied to power supply conductor 18. Any negative voltage, say −24.0 volts DC on power supply conductor 18, reverse biases transistor 14 and shuts off current flow to power supply conductor 24.

Figure 2:
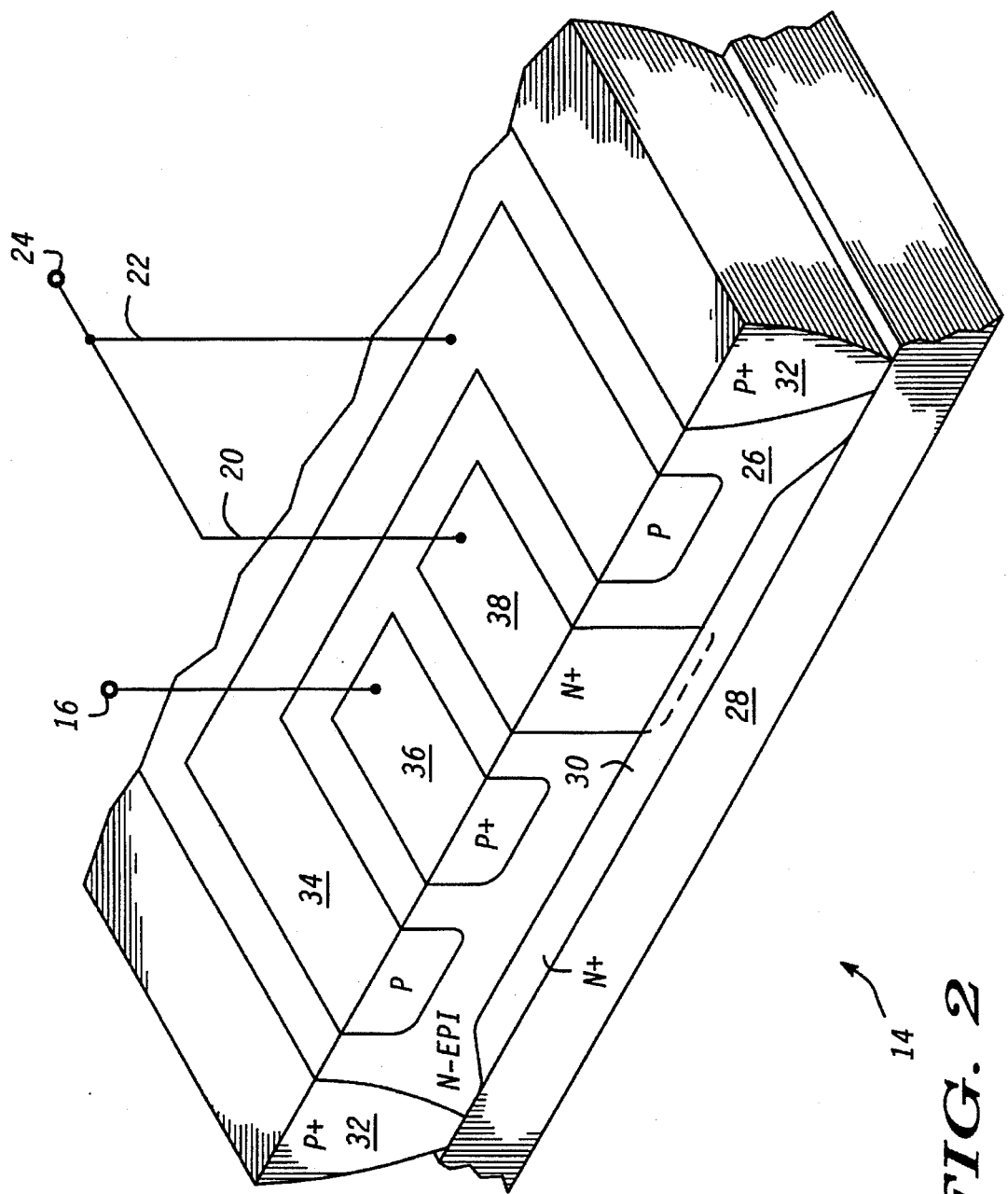
FIG. 2 illustrates an isometric view of the diode-configured lateral PNP transistor with the base contact placed inside of the collector ring.

An isometric view of the lateral PNP transistor 14 is shown in FIG. 2. An epitaxial layer 26 about 15.0 microns thick and made of N-type semiconductor material doped with phosphorus is disposed on monocrystalline silicon substrate region 28 that forms a foundation of transistor 14. Substrate 28 is composed of P-type semiconductor material. Alternately, substrate 28 may be made of gallium arsenide, silicon on sapphire, germanium, germanium silicon or like semiconductor material. An N+ buried layer 30 such as arsenic or antimony is formed about 3.0 microns thick on substrate 28 by methods well known in the art. Isolation region 32 made of a P+ type semiconductor material is formed in epitaxial layer 26 to isolate PNP transistor 14. Isolation region 32 is formed by methods such as photoresist mask and dopant diffusion.

A collector ring 34 made of P-type semiconductor material such as boron is formed as a well in epitaxial layer 26. Collector ring 34 operates as collector 22 of transistor 14. Collector ring 34 has 8.0 microns of channel width and 3.0 microns of channel depth. A well 36 made of P-type semiconductor material such as boron is formed in epitaxial layer 26 and operates as emitter 16 of transistor 14. Well 36 is 80.0 microns long, 8.0 microns wide, and has 3.0 microns of channel depth. A well 38 made of N+-type semiconductor material is formed in epitaxial layer 26 and operates as base 20 of transistor 14. Well 38 is 80.0 microns long, 8.0 microns wide, and 15.0 microns deep extending into buried layer 30. The separation between isolation region 32 and collector ring 34 is about 14.0 microns, and the separation between collector ring 34 and well 36 is about 14.0 microns. Likewise, the separation between well 36 and well 38 is about 14.0 microns, and the separation between well 38 and the opposite side of collector ring 34 is about 14.0 microns. Although a cut-away view of transistor 14 is shown in the isometric drawing of FIG. 2, collector ring 34 completely encircles emitter region 36 and base region 38. Emitter region 36 and base region 38 are disposed adjacent to one another and surrounded by collector ring 34. The collector ring and wells are formed by process methods such as photoresist mask, doping, and etching processes.

The operation of diode configured transistor 14 proceeds as follows. The specific structure of the lateral PNP transistor described above, with base region 38 completely enclosed by collector ring 34, allows the device to operate in three distinct modes. Assume a positive battery voltage $V_{BATTERY}=12.0$ volts. In the first mode of operation, transistor 14 operates in a low current mode, say 100.0 microamps, as a classic diode-configured lateral transistor having a PN junction. Emitter region 36 is the P region, and the base region 38 is the N region. The base region 38 is effectively lightly doped in comparison to the second mode of operation described below. When transistor 14 is forward biased, minority carriers are injected into the P region and N region to facilitate a current flow. The vast majority (99%) of the emitter current is collected by collector region 34. The remaining emitter current (1%) appears as base current. The substrate current is substantially zero. Thus, transistor 14 operates as a conventional diode when conducting small currents in the microamp range.

In the second mode of operation, transistor 14 conducts a high current of say 1.0 amp for example to supply switching transistors in the internal circuitry that conduct high currents during switching. In the high current mode, an excessive number of minority carriers are injected into base region 38, far more than collector ring 34 can collect. The excessive number of minority carriers cause semiconductor regions 26, 36 and 38 to become conductivity modulated that effectively increases the doping concentration in the base and emitter regions by orders of magnitude over the background doping concentration, and provides positive charges (holes) to recombine with the minority carriers. Conductivity modulation lowers the bulk resistance with the higher doping concentration. Thus, in the high current mode, conductivity modulation allows transistor 14 to maintain a low bulk series resistance through the PN junction which provides low forward voltage drop of 1.0 volt or less while conducting relatively large currents in the amp range. The majority (90%) of the emitter current appears as base current. The remaining emitter current (10%) is collected by substrate 28. The collector current is substantially zero. Therefore, transistor 14 may be kept small because it does not require the large number of emitters commonly used in the prior art.

In the third mode of operation, transistor 14 transitions between the aforedescribed conventional lateral PNP transistor diode and conductivity modulation mode. That is, the third mode of operation is a cross-over between the first and second modes. In the third mode, lateral PNP transistor 14 operates as a poor diode with a high bulk resistance and a low forward current gain (beta <0.1) because it is conducting higher current but is not yet in full conductivity modulation. Just before the onset of conductivity modulation, base region 38 is still relatively lightly doped with a poor beta that tends to form substrate PNP junctions and cause undesirable substrate currents to flow during the third mode of operation. Approximately 50% of the emitter current flows into substrate region 28. About 25% of the emitter current is collected by collector ring 34. The remaining 25% appears as base current. Hence, it is important to minimize the third mode of operation as the cross-over between the first and second modes of operation.

As part of the present invention, the base region 38 is formed inside collector ring 34 and adjacent to emitter region 36. By placing base region 38 inside collector ring 34, the bulk resistance is kept small to aid in the onset of conductivity modulation. The low bulk resistance also keeps the forward voltage drop low when operating in high current mode. Transistor 14 is made small to maintain high current densities so that it enters conductivity modulation with a high degree of minority carrier injection. Thus, the base region 38 inside collector ring 34 minimizes the window of operation in the third mode.

If $V_{BATTERY}$ should become negative, for example −24 volts, emitter 16 becomes reverse biased with respect to base 20. Substantially no current flow through transistor 14 which protects the internal circuitry of IC 12. Transistor 14 provides reverse voltage protection up to say −100.0 volts.

In an alternate embodiment, an NPN transistor could be configured as a diode for reverse voltage protection. The NPN transistor would have its P-type base region disposed adjacent to an N-type emitter region and surrounded by an N-type collector ring as described above. The operation of the NPN transistor is analogous to the PNP transistor described above.

By now it should be appreciated that the present invention provides a lateral transistor configured as a reverse protection diode that allows low and high current modes of operation while maintaining low forward voltage drop. The base region of the lateral transistor is formed inside the collector ring and adjacent to the emitter region. In low current mode, the transistor operates as a conventional diode. In high current mode, the excessive number of minority carriers injected into the base region causes the device to enter conductivity modulation that effectively increases the doping concentration and lowers the bulk resistance. The lower bulk resistance keeps the forward voltage drop low. By having the base region inside the collector ring, the bulk resistance is kept low to aid in the onset of conductivity modulation. Thus, the transition between low current mode and high current mode is minimized. The reverse protection transistor runs at low current and high current while minimizing substrate current and maintaining a low forward voltage drop across the transistor.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A reverse protection circuit, comprising a lateral transistor having an emitter region with a first conductivity type disposed in an epitaxial region having a second conductivity type and coupled to a first power supply conductor, and a base region and collector region coupled together to a second power supply conductor, where said collector region has said first conductivity type disposed in said epitaxial region having said second conductivity type and forms a collector ring that surrounds said base region of said lateral transistor.

2. The reverse protection circuit of claim 1 wherein said emitter region is disposed adjacent to said base region within said collector ring.

3. The reverse protection circuit of claim 2 wherein said base region is made of N-type semiconductor material.

4. The reverse protection circuit of claim 3 wherein said emitter region is made of P-type semiconductor material.

5. The reverse protection circuit of claim 4 wherein said collector ring is made of P-type semiconductor material.

6. The reverse protection circuit of claim 5 further including a substrate region forming a foundation of said lateral transistor.

7. The reverse protection circuit of claim 6 further including a buried layer disposed above said substrate region.

8. The reverse protection circuit of claim 7 further including said epitaxial region formed above said buried layer where said collector ring is formed with a first well in said epitaxial region.

9. The reverse protection circuit of claim 8 wherein said base region is formed with a second well in said epitaxial region extending down into said buried layer.

10. The reverse protection circuit of claim 9 wherein said emitter region is formed with a third well in said epitaxial region.

11. A lateral transistor, comprising:

an emitter region having a first conductivity type disposed in an epitaxial region having a second conductivity type and coupled to a first power supply conductor;

a base region coupled to a second power supply conductor; and a collector region coupled to said base region where said collector region has said first conductivity type disposed in said epitaxial region having said second conductivity type and forms a collector ring that surrounds said base region of said lateral transistor.

12. The lateral transistor of claim 11 wherein said emitter region is disposed adjacent to said base region within said collector ring.

13. The lateral transistor of claim 12 wherein said base region is made of N-type semiconductor material, said emitter region is made of P-type semiconductor material, and said collector ring is made of P-type semiconductor material.

14. The lateral transistor of claim 13 further including:

a substrate region forming a foundation of said lateral transistor;

a buried layer disposed above said substrate region; and

Wherein said epitaxial region is formed above said buried layer and said collector ring is formed with a first well in said epitaxial region.

15. The lateral transistor of claim 14 wherein said base region is formed with a second well in said epitaxial region extending down into said buried layer.

16. The lateral transistor of claim 15 wherein said emitter region is formed with a third well in said epitaxial region.

17. A method of reverse voltage protection, comprising the steps of:

providing a lateral transistor having an emitter region with a first conductivity type disposed in an epitaxial region having a second conductivity type and coupled to a first power supply conductor, and a base region and collector region coupled together to a second power supply conductor, said collector region having said first conductivity type disposed in said epitaxial region having said second conductivity type and forming a collector ring that surrounds said base region of said lateral transistor; and reverse biasing said emitter region and said epitaxial region upon application of a negative potential to said first power supply conductor to block current flow between said collector region and said emitter region.

18. The method of claim 17 further comprising the step of operating said lateral transistor in a first mode where said lateral transistor conducts a first current from said emitter region to said collector region in response to a positive potential applied to said first power supply conductor, said emitter region and said epitaxial region each have a first bulk resistance.

19. The method of claim 18 further comprising the step of operating said lateral transistor in a second mode where said lateral transistor conducts a second current greater than said first current from said emitter region to said base region, where said emitter region injects minority carriers into said epitaxial region in excess of a number that said collector region can collect which causes conductivity modulation of said emitter region and said epitaxial region so that each has a second bulk resistance less than said first bulk resistance.

20. A method of operating a lateral transistor having an emitter region with a first conductivity type disposed in an epitaxial region having a second conductivity type and coupled to a first power supply conductor, and a base region and collector region coupled together to a second power supply conductor, the collector region having the first conductivity type disposed in the epitaxial region having the second conductivity type and forming a collector ring that surrounds the base region of the lateral transistor, the method comprising the steps of:

conducting a first current from the emitter region to the collector region of the lateral transistor in a first operating mode in response to a positive potential applied to the first power supply conductor so that the emitter region and the epitaxial region each have a first bulk resistance; and conducting a second current greater than the first current from the emitter region to the base region of the lateral transistor in a second operating mode, where the emitter region injects minority carriers into the epitaxial region in excess of a number that the collector region can collect which causes conductivity modulation of the emitter region and the epitaxial region so that each has a second bulk resistance less than the first bulk resistance.

\* \* \* \* \*